United States Patent
Yeh et al.

(10) Patent No.: US 8,357,574 B2
(45) Date of Patent: Jan. 22, 2013

(54) METHOD OF FABRICATING EPITAXIAL STRUCTURES

(75) Inventors: Ming-Hsi Yeh, Hsinchu (TW); Hsien-Hsin Lin, Hsinchu (TW); Hui Ouyang, Chubei (TW); Chi-Ming Yang, Hsian-San District (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/904,633

(22) Filed: Oct. 14, 2010

(65) Prior Publication Data

US 2012/0094448 A1 Apr. 19, 2012

(51) Int. Cl.
- *H01L 21/8238* (2006.01)
- *H01L 21/336* (2006.01)
- *H01L 21/4763* (2006.01)
- *H01L 21/3205* (2006.01)

(52) U.S. Cl. ........ 438/199; 438/290; 438/257; 438/301; 438/585; 438/791; 257/E21.431; 257/E21.632

(58) Field of Classification Search ........... 257/E21.431, 257/E21.632

See application file for complete search history.

(56) References Cited

U.S. PATENT DOCUMENTS

| | | | |
|---|---|---|---|
| 5,525,552 A * | 6/1996 | Huang | 438/297 |
| 8,119,473 B2 * | 2/2012 | Huang et al. | 438/199 |
| 2006/0147692 A1 * | 7/2006 | Kmetz | 428/292.1 |
| 2007/0042612 A1 * | 2/2007 | Nishino et al. | 438/785 |
| 2008/0026251 A1 * | 1/2008 | Suzuki et al. | 428/702 |
| 2008/0168418 A1 * | 7/2008 | Zia et al. | 716/20 |
| 2008/0217686 A1 * | 9/2008 | Majumdar et al. | 257/347 |
| 2010/0213822 A1 * | 8/2010 | Shimooka et al. | 313/503 |
| 2012/0001238 A1 * | 1/2012 | Tsai et al. | 257/255 |

FOREIGN PATENT DOCUMENTS

WO  WO 2009017206 A1 *  2/2009

* cited by examiner

*Primary Examiner* — Mohsen Ahmadi (74) *Attorney, Agent, or Firm* — Haynes and Boone, LLP (57) ABSTRACT

A method for fabricating an integrated device is disclosed. The disclosed method provides improved formation selectivity of epitaxial films over a pre-determined region designed for forming an epi film and a protective layer preferred not to form an epi, polycrystalline, or amorphous film thereon during an epi film formation process. In an embodiment, the improved formation selectivity is achieved by providing a nitrogen-rich protective layer to decrease the amount of growth epi, polycrystalline, or amorphous film thereon.

20 Claims, 9 Drawing Sheets

METHOD OF FABRICATING EPITAXIAL STRUCTURES

BACKGROUND

The present disclosure relates generally an integrated circuit (IC) device and, more particularly, to method for forming a complementary metal oxide semiconductor (CMOS) structure.

As technology nodes shrink, in some IC designs, there has been a desire to incorporate strained engineering, including SiGe, SiC, SiP and/or Si epitaxial (epi) process, in the formation process of CMOS devices to overcome Moore's law.

There are challenges to implement such epi features and processes in CMOS fabrication. As technology nodes continue to decrease, particularly to 22 nm technology node and below, the formation selectivity between a pre-determined region designed for the formation of the epi film and a protective layer not suitable for the formation of the epi, polycrystalline, or amorphous film thereon during an epi formation process is a key challenge for forming the epi film. A low formation selectivity means that there is no significant difference between a growth rate of an epi film formed on the pre-determined region and a growth rate of an epi, polycrystalline, or amorphous film formed on the protective layer. It may subsequently cause epi loss on the pre-determined region when removing the unwanted epi, polycrystalline, or amorphous film on the protective layer, and thereafter resulting defects in CMOS device and impact the yield of device. Alternatively, tuning a low epi formation rate may be helpful for increasing the epi formation selectivity between different regions. However, the decreased epi formation rate decreases the throughput of IC production.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to manufacturing integrated circuit devices, and more particularly, to protective layers used during the manufacturing the integrated circuit devices.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-18, a method 100 and a semiconductor device 200 are collectively described below. The semiconductor device 200 illustrates an integrated circuit, or a portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after methods disclosed, and some of the steps described below can be replaced or eliminated, for additional embodiments of the method. It is further understood that additional features can be added in the semiconductor devices disclosed, and some of the features described below can be replaced or eliminated, to disclose additional embodiments.

Figure 1:
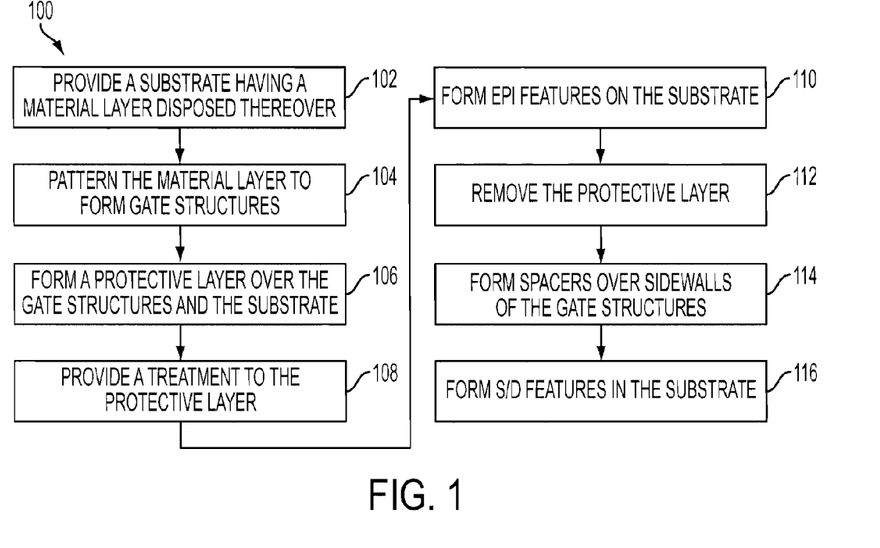
FIG. 1 is a flow chart of a method for fabricating an integrated circuit device according to aspects of the present disclosure.
Figure 2:
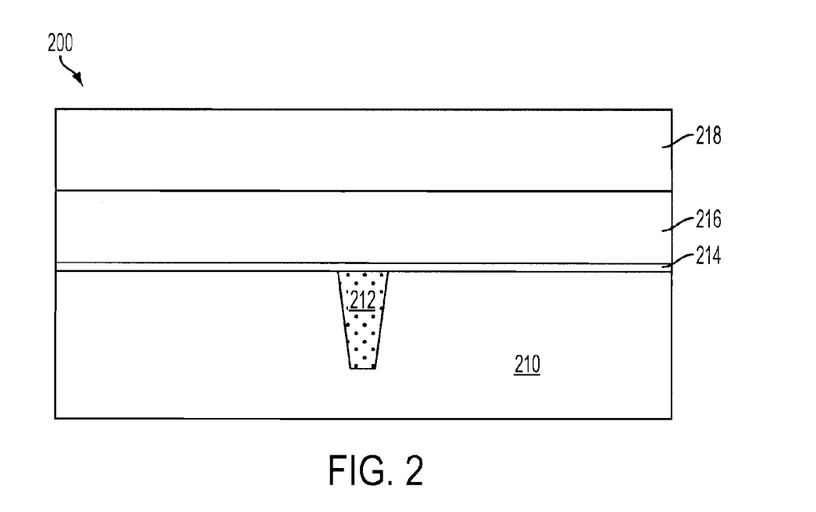
FIGS. 2-18 are various cross-sectional views of embodiments of an integrated circuit device during various fabrication stages according to the method of FIG. 1.

Referring to FIGS. 1 and 2, the method 100 begins at step 102 wherein a substrate 210 is provided. In the depicted embodiment, the substrate 210 is a semiconductor substrate including silicon. The substrate may be a p-type or n-type substrate. Alternatively, the substrate 210 comprises another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

The substrate 210 may include various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS, NFET, and/or PFET technology processing, and thus some processes are not described in detail herein.

An exemplary isolation feature 212 is formed in the substrate 210 to isolate various regions of the substrate 210, and in the present embodiment, to isolate the NMOS and PMOS device regions. The isolation feature 212 also isolates the device regions from other devices (not shown). The isolation feature 212 utilizes isolation technology, such as local oxidation of silicon (LOCOS) and/or shallow trench isolation (STI), to define and electrically isolate the various regions. In the present embodiment, the isolation feature 212 includes an STI. The isolation feature 212 comprises silicon oxide, silicon nitride, silicon oxynitride, other suitable materials, or combinations thereof. The isolation feature 212 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure, such as a thermal oxide liner layer filled with silicon nitride or silicon oxide.

A material layer is formed over the substrate. The material layer includes one or more material layers comprising any suitable material and thickness. The material layer can include interfacial layers, capping layers, diffusion/barrier layers, adhesion layers, other suitable layers, and/or combinations thereof. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The semiconductor device 200 may include one or more antireflective coating layers, such as a top antireflective coating layer and/or a bottom antireflective coating layer.

In one embodiment, the material layer includes a gate dielectric layer 214, a gate electrode layer 216, and a hard mask layer 218. The gate dielectric layer 214 is formed over the substrate 210 by any suitable process to any suitable thickness. The gate dielectric layer 214 includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. The gate dielectric layer 214 may include a multilayer structure. For example, the gate dielectric layer 214 may include an interfacial layer, and a high-k dielectric material layer formed on the interfacial layer. An exemplary interfacial layer may be a grown silicon oxide layer formed by a thermal process or ALD process.

The gate electrode layer 216 is formed over the gate dielectric layer 214 by any suitable process to any suitable thickness. In the present embodiment, the gate electrode layer 216 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate electrode layer 216 could include a conductive layer having a proper work function; therefore, the gate electrode layer 216 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate electrode layer 216 may include other conductive materials, such as aluminum, copper, tungsten, metal alloys, metal silicide, other suitable materials, or combinations thereof. For example, where the gate electrode layer 216 includes a work function layer, another conductive layer can be formed over the work function layer.

The hard mask layer 218 is formed over the gate electrode layer 216 by any suitable process to any suitable thickness. The hard mask layer 218, in one embodiment, includes silicon oxide. The hard mask layer 218, in another embodiment, may include silicon nitride (SiN), silicon oxynitride (SiON), silicon carbide (SiC), SiOC, spin-on glass (SOG), a low-k film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 300 Angstrom to about 800 Angstrom.

Figure 3:
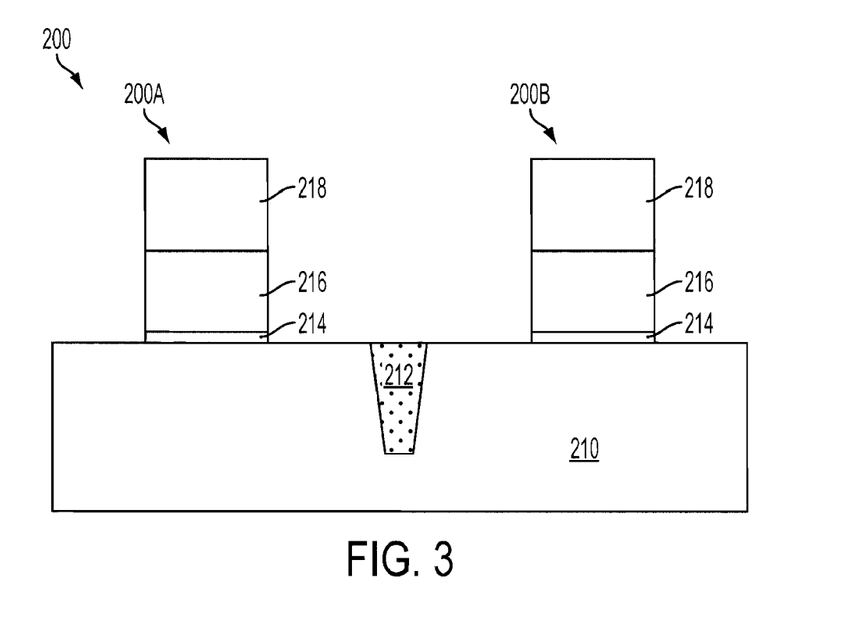

Referring to FIGS. 1 and 3, the method 100 proceeds to step 104 in which a patterning process is applied to the hard mask layer 218, the gate electrode layer 216, and the gate dielectric layer 214 to form gate structures for a PMOS device 200A and a NMOS device 200B over the substrate 210. Each gate structure comprises a gate dielectric 214 and a gate electrode 216, and has a hard mask 218 formed thereon. The patterning process, for example, includes forming a layer of photoresist (not shown) over the hard mask layer 218 by a suitable process, such as spin-on coating, and then exposing and developing the layer of photoresist to form a photoresist feature. Then, pattern of the photoresist feature can be transferred to the underlying gate dielectric layer 214, the gate electrode layer 216, and the hard mask layer 218 to form the gate structures by a dry etching process. Additionally, an anti-reflective coating (ARC) layer (not shown) may be formed on the hard mask layer 218 and under the layer of photoresist to enhance a subsequent patterning process as known in the art. The photoresist feature may be stripped thereafter. It is understood that the above examples do not limit the processing steps that may be utilized to form the gate structures.

Figure 4:
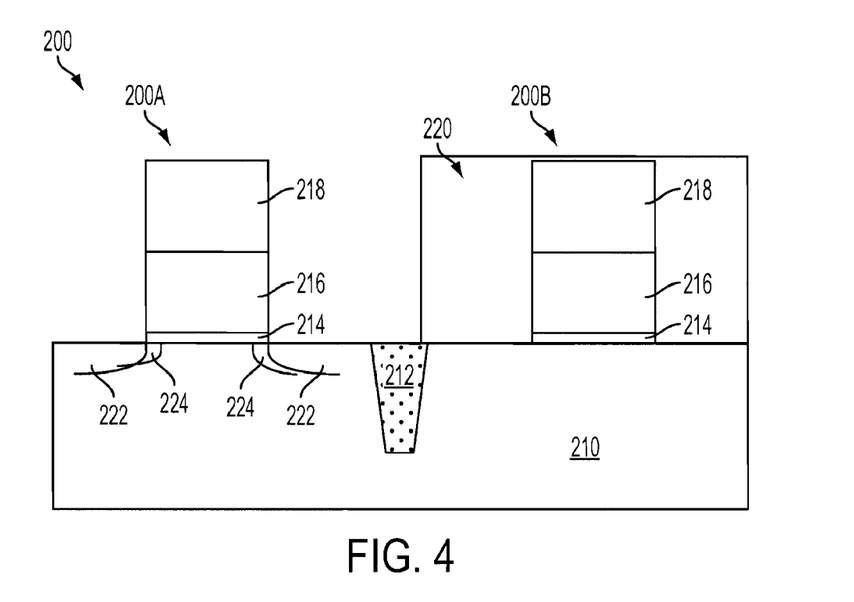

Referring to FIG. 4, various implantation processes are provided to form various doped regions in the PMOS device 200A. Doped regions are not formed around the NMOS device 200B because of a covering protector 220, e.g., a photoresist pattern, thereon. The doped regions may comprise various doping profiles and may be formed by a plurality of implantation processes. In one embodiment, P-type lightly doped source/drain (PLDD) regions 222 may be formed in the substrate by one or more ion implantation processes. The PLDD regions 222 are substantially aligned with edges of the gate structure of the PMOS device 200A. In another embodiment, N-type pocket regions 224 may be formed adjacent to the PLDD regions 222 and under the edges of the gate structure of the PMOS device 200A by one or more ion implantation processes. The implantation for forming the PLDD/N-type pocket regions 222, 224 may employ tilt angle processes by any suitable angles. In one embodiment, approximately 25° to about 30° of the tilt angle is utilized. Thereafter, the protector 220 is removed by a stripping process known in the art.

Figure 5:
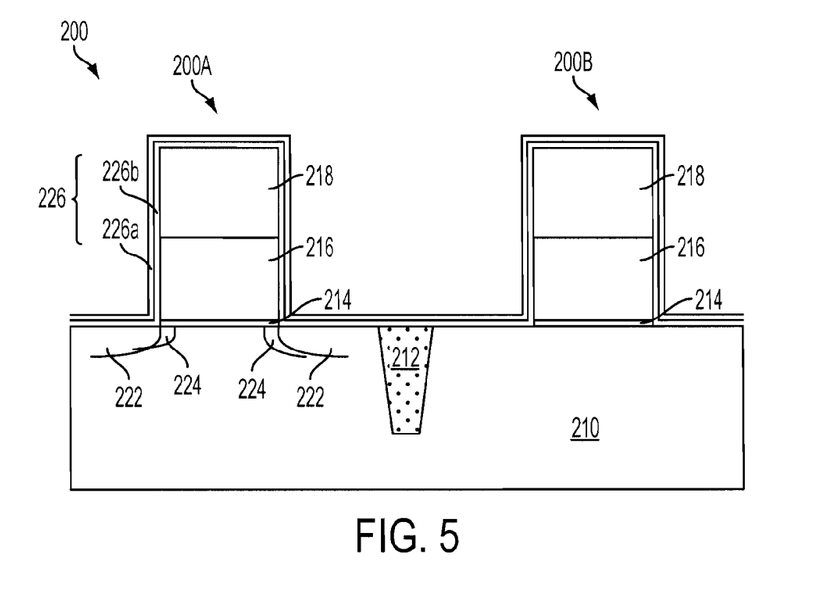

Referring to FIGS. 1 and 5, the method 100 proceeds to step 106 in which a protective layer 226 is formed over the substrate 210, the gate structures of the PMOS device 200A and the NMOS 200B. In some embodiments, the protective layer 226 comprises a top protective layer 226a and a bottom protective layer 226b.

The top protective layer 226a may function as a protector to decrease an amount of an epi, polycrystalline, or amorphous film formed thereon during a subsequent epi growth process. In some embodiments, the top protective layer 226a is a nitrogen-rich layer. In one embodiment, the top protective layer 226a is a nitrogen-containing and silicon-containing layer with an observed atomic ratio of Nitrogen to Silicon of greater than one. In another embodiment, the top protective layer 226a is a nitrogen-rich nitride layer ($Si_xN_y$) with an observed atomic ratio of Nitrogen to Silicon being greater than one (y/x>1), e.g., $Si_3N_4$. In other embodiments, the top protective layer 226a is a nitrogen-containing, silicon-containing, and oxygen-containing layer ($Si_xN_yO_z$) with an observed atomic ratio of Nitrogen to Silicon being greater than one (y/x>1). The nitrogen-rich nitride layer has limited silicon dandling bonds on the surface, therefore, less epi, polycrystalline, or amorphous film formed thereon during the subsequent epi growth process. That is, a high formation selectivity of growth epi film is achieved between a predetermined region designed for forming the epi film and the top protective layer 226a preferred not to form epi, polycrystalline or amorphous film thereon. In the depicted embodiment, the top protective layer 226a has a thickness ranging between about 50 Angstroms and about 500 Angstroms. In some embodiments, the top protective layer 226a is formed using chemicals including $Si_2Cl_6$ and $NH_3$. In another embodiment, the top protective layer 226a is formed using chemicals including $Si_2Cl_6$ with a flow rate ranging from about 10 sccm to about 100 sccm and $NH_3$ with a flow rate ranging from about 1000 sccm to about 5000 sccm. In other embodiment, the top protective layer 226a is formed using chemicals including $Si_2Cl_6$ with a flow rate ranging from about 10 sccm to about 100 sccm and $NH_3$ with a flow rate ranging from about 2000 sccm to about 5000 sccm. In some embodiments, the top protective layer 226a is formed with a deposition pressure ranging between about 10 militorr and about 100 militorr, a deposition temperature ranging between about 400° C. and about 600° C., and a process time ranging between about 1 min and about 60 min, by LPCVD, PECVD, or ALD.

The bottom protective layer 226b may function as buffer layer to provide an etching selectivity between the top protective layer 226a and the hard mask 218. In some embodiments, the bottom protective layer 226b includes a material different from the top protective layer 226a or the hard mask 218. The bottom protective layer 226b, for example, is silicon oxide and/or oxynitride, formed by LPCVD, PECVD, or ALD. The bottom protective layer 226b has a thickness ranging between about 10 Angstroms and about 100 Angstroms.

Figure 6:
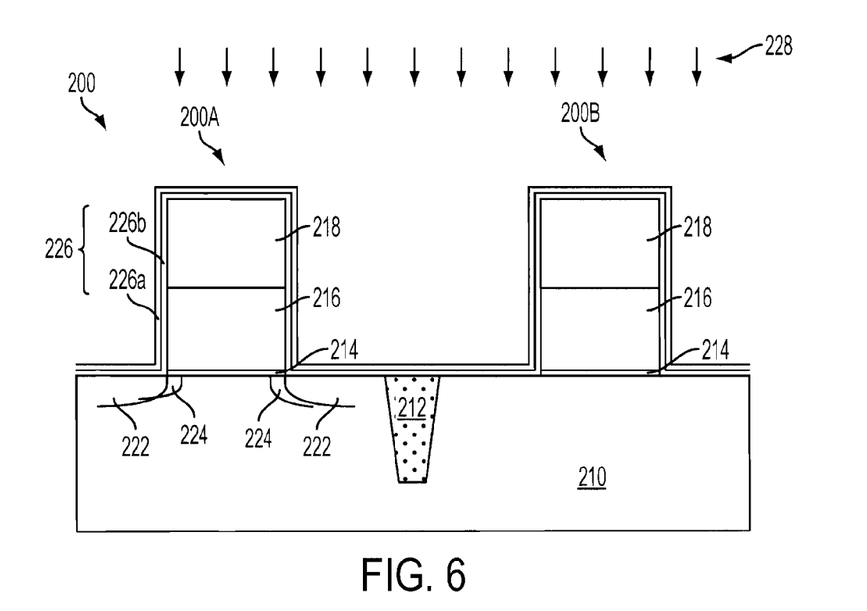

Referring to FIGS. 1 and 6, the method 100 proceeds to step 108 in which a treatment 228 is provided to the top protective layer 226a. In one embodiment, the treatment 228 is performed by providing an energy source, such as thermal process, plasma process, or other suitable processes including ion implantation process, e-beam, ultraviolet (UV), or combinations thereof. In some embodiments, the treatment 228 introduces additional species into the top protective layer 226a, wherein the introduced species may react with the surface of the top protective layer 226a to further reduce the numbers of silicon dangling bonds. In one embodiment, the treatment 228 is performed in an oxygen-containing ambient. In another embodiment, the treatment 228 is performed using oxygen gas, ozone gas, $N_2O$ gas, $NO_2$ gas, or combinations thereof. In other embodiments, the treatment 228 consists of oxygen gas ranging from about 1 ppm to about 1000 ppm. In some embodiments, the treatment 228 is performed at a temperature ranging between about 500° C. and about 1100° C.

Figure 7:
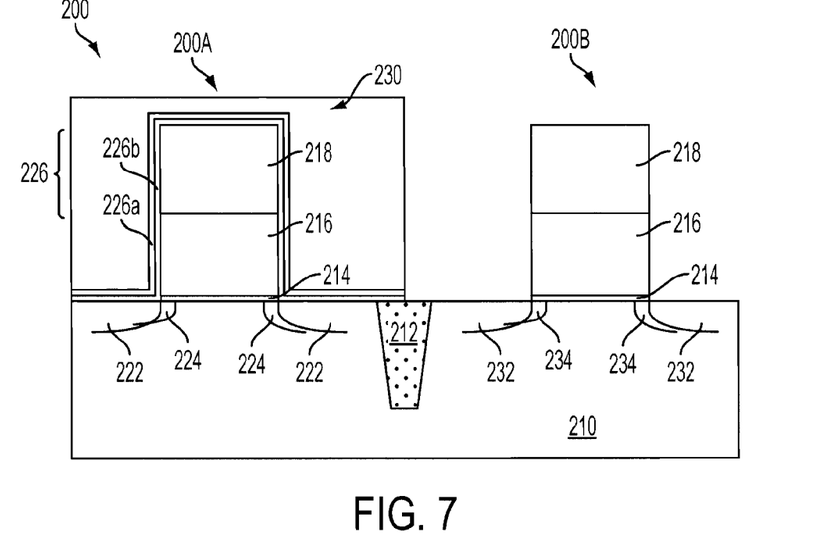

Referring to FIG. 7, a protector 230 is provided on a portion of the protective layer 226 over the PMOS device 200A. In the depicted embodiment, the protector 230 is formed over the PMOS device 200A to protect the PMOS device 200A during a later etching process for removing another portion of the protective layer 226 over the NMOS device 200B. The protector 230 may be formed by providing a layer (not shown), e.g., photo-resist layer or hard mask layer, on the substrate 210, the PMOS device 200A, and the NMOS device 200B, and then providing a patterning process to remove a portion of the layer over the NMOS device 200B but leave the protector 230 over the PMOS device 200A. An etching process is then provided to sequentially remove a portion of the top protective layer 226a not covered by the protector 230 and the underlying bottom protective layer 226b to expose the a portion of the substrate 210 around the NMOS device 200B. The etching process, for example, may include a first etching step using $Cl_2$, HBr, $CH_2F_2$, $CHF_3$, $CF_4$, or combinations thereof to remove the top protective layer 226a, and a second etching step using $CH_2F_2$, $CHF_3$, $CF_4$, or combinations thereof to remove the bottom protective layer 226b.

Still referring to FIG. 7, various implantation processes are provided to form various doped regions in the NMOS device 200B. Doped regions are not formed around the PMOS device 200A at the same time by covering the protector 230 thereon. The doped regions may comprise various doping profiles and may be formed by a plurality of implantation processes. In one embodiment, N-type lightly doped source/drain (NLDD) regions 232 may be formed in the substrate by one or more ion implantation processes. The NLDD regions 232 are substantially aligned with edges of the gate structure of NMOS device 200B. In another embodiment, P-type pocket regions 234 may be formed adjacent to the NLDD regions 232 and under the edges of the gate structure of NMOS device 200B by one or more ion implantation processes. The implantation for forming the NLDD/P-type pocket regions 232, 234 may employ tilt angle processes by any suitable angles. In one embodiment, approximately 25° to about 30° of the tilt angle is utilized. Thereafter, the protector 230 may be removed by a stripping process known in the art.

Figure 8:
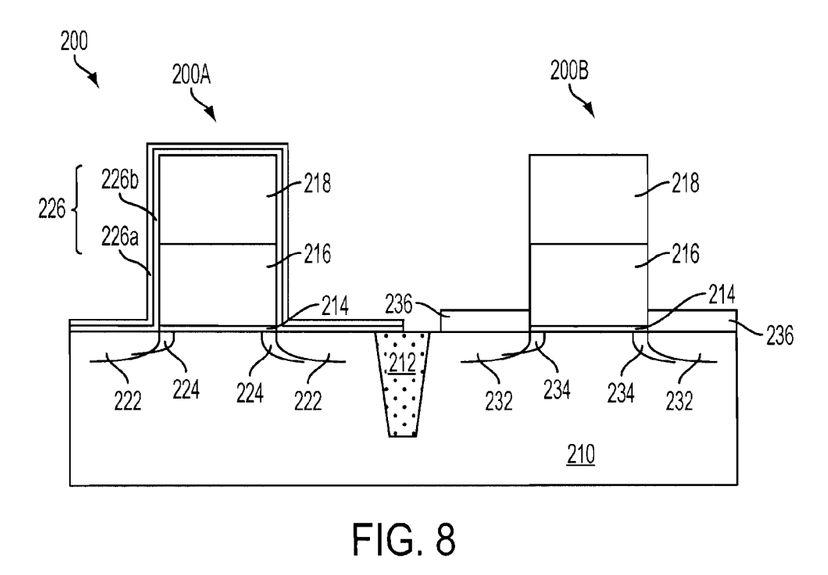

Referring to FIGS. 1 and 8, the method 100 proceeds to step 110 in which features 236 are formed in the NMOS device 200B. In the depicted embodiment, the features 236 are on the substrate 210 and adjacent to the gate structure for the NMOS device 200B. In one embodiment, the features 236 include a semiconductor material that is the same as the substrate 210. In another embodiment, the features 236 include silicon (Si). In the depicted embodiment, the features 236 are formed by epi growth process. The epi growth process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors, which may interact with the composition of the substrate 210. In some embodiments, the features 236 are raised epi features with a top surface higher than the surface of the substrate 210.

Figure 9:
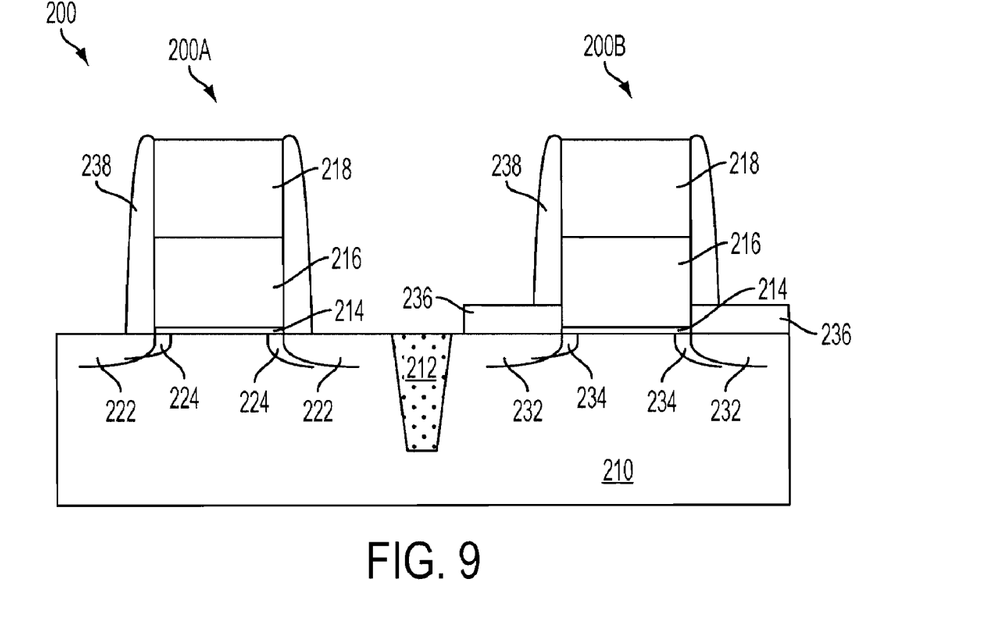

Referring to FIGS. 1 and 9, the method 100 proceeds to step 112 in which the portion of the protective layer 226 over the gate structure for the PMOS device 200A is removed. In some embodiments, the portions of the top/bottom protective layers 226a/226b may be continuously removed by using the chemicals as mentioned above.

Still referring to FIGS. 1 and 9, the method 100 proceeds to step 114 in which, spacers 238 are formed overlying sidewalls of the gate structures of the PMOS device 200A and the NMOS device 200B. In some embodiments, spacers 238 are formed over at least a portion of the features 236 adjacent to the sidewalls of the gate structures of the NMOS device 200B.

In the depicted embodiment, spacers 238 may be formed by blanket depositing a dielectric spacer layer (not shown), such as a silicon nitride layer, over the PMOS device 200A and the NMOS device 200B, and then the dielectric layer is anisotropically etched to form the spacers 238. Alternatively, liners (not shown) may be included under the spacers 238 by forming a dielectric liner layer, e.g., a silicon oxide layer, under the spacer layer, and then the spacer layer and the liner layer are etched in sequence to form the spacers 238 and the underlying liners. In still another embodiment, the spacers 238 may include other dielectric materials, such as silicon oxide, silicon oxynitride, or combinations thereof.

Figure 10:
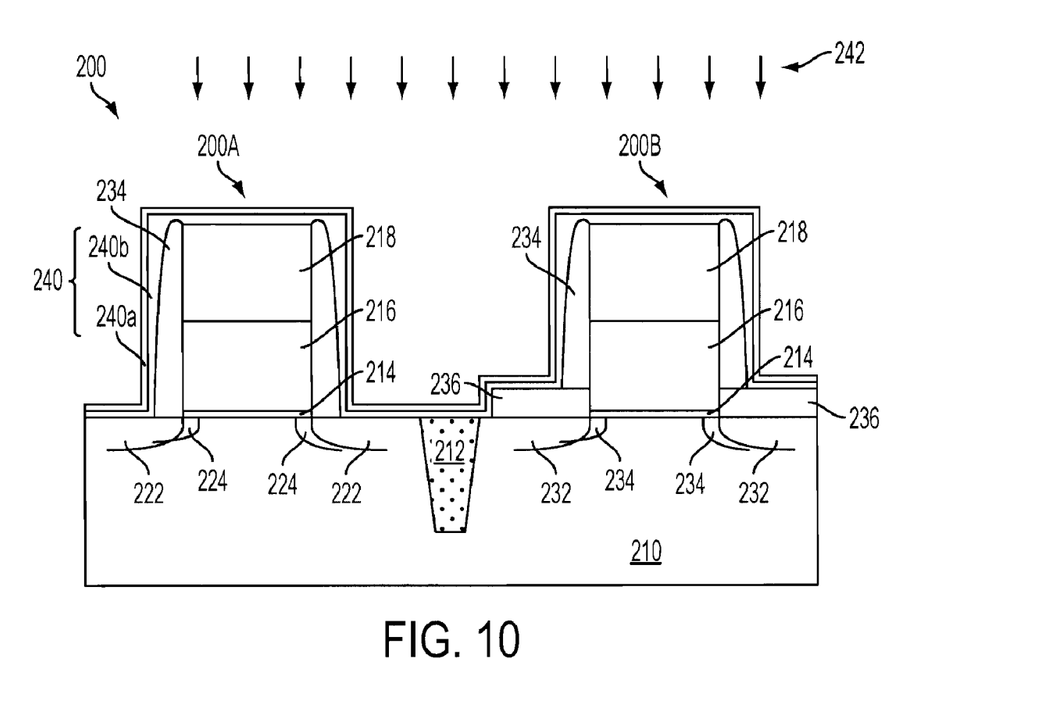

Referring to FIG. 10, a protective layer 240 is formed over the substrate 210, the gate structures of the PMOS device 200A and the NMOS 200B. In some embodiments, the protective layer 240 comprises a top protective layer 240a and a bottom protective layer 240b.

The top protective layer 240a may function as a protector to decrease an amount of a growth epi, polycrystalline, or amorphous film formed thereon during a subsequent epi growth process. In some embodiments, the top protective layer 240a is a nitrogen-rich layer. In one embodiment, the top protective layer 240a is a nitrogen-containing and silicon-containing layer with an observed atomic ratio of Nitrogen to Silicon being greater than one. In another embodiment, the top protective layer 240a is a nitrogen-rich nitride layer ($Si_xN_y$) with an observed atomic ratio of Nitrogen to Silicon being greater than one (y/x>1), e.g., $Si_3N_4$. In other embodiments, the top protective layer 240a is a nitrogen-containing, silicon-containing, and oxygen-containing layer ($Si_xN_yO_z$) with an observed atomic ratio of Nitrogen to Silicon being greater than one (y/x>1). As mentioned above, the nitrogen-rich nitride layer has limited silicon dandling bonds on the surface and, therefore, less epi, polycrystalline, or amorphous film is formed thereon during the subsequent epi growth process. Hence, a high epi formation selectivity is achieved between a pre-determined region over the substrate 210 and the top protective layer 240a, wherein the pre-determined region is designed for the epi film formation and the top protective layer 240a is not suitable for the epi, polycrystalline, or amorphous film formation thereon. In the depicted embodiment, the top protective layer 240a has a thickness ranging between about 50 Angstroms and about 500 Angstroms. In some embodiments, the top protective layer 240a is formed using chemicals including $Si_2Cl_6$ and $NH_3$. In another embodiment, the top protective layer 240a is formed using chemicals including $Si_2Cl_6$ with a flow rate ranging from about 10 sccm to about 100 sccm and $NH_3$ with a flow rate ranging from about 1000 sccm to about 5000 sccm. In other embodiments, the top protective layer 240a is formed using chemicals including $Si_2Cl_6$ with a flow rate ranging from about 10 sccm to about 100 sccm and $NH_3$ with a flow rate ranging from about 2000 sccm to about 5000 sccm. In some embodiments, the top protective layer 240a is formed with a deposition pressure ranging between about 10 militorr and about 100 militorr, a deposition temperature ranging between about 400° C. and about 600° C., and a process time ranging between about 1 min and about 60 min, by LPCVD, PECVD, or ALD.

The bottom protective layer 240b may function as buffer layer to provide an etching selectivity between the top protective layer 240a and the hard mask 218. In some embodiments, the bottom protective layer 240b includes a material different from the top protective layer 240a or the hard mask 218. The bottom protective layer 240b, for example, is oxide and/or oxynitride, formed by LPCVD, PECVD or ALD. The bottom protective layer 240b has a thickness ranging between about 10 Angstroms and about 100 Angstroms.

Still referring to FIG. 10, a treatment 242 is provided to the top protective layer 240a. In one embodiment, the treatment 242 may introduce additional species and react with the surface of the top protective layer 240a to further reduce the number of silicon dangling bonds by an energy source. The energy source of the treatment 242 may employ a thermal process, plasma process, or other suitable processes including ion implantation process, e-beam, ultraviolet (UV), or combinations thereof. In one embodiment, the treatment 242 is performed in an oxygen-containing ambient. In another embodiment, the treatment 242 is performed using oxygen gas, ozone gas, $N_2O$ gas, $NO_2$ gas, or combinations thereof. In other embodiments, the treatment 242 consists of about 1 ppm to about 1000 ppm $O_2$. In some embodiments, the treatment 242 is performed at a temperature ranging between about 500° C. and about 1100° C.

Figure 11:
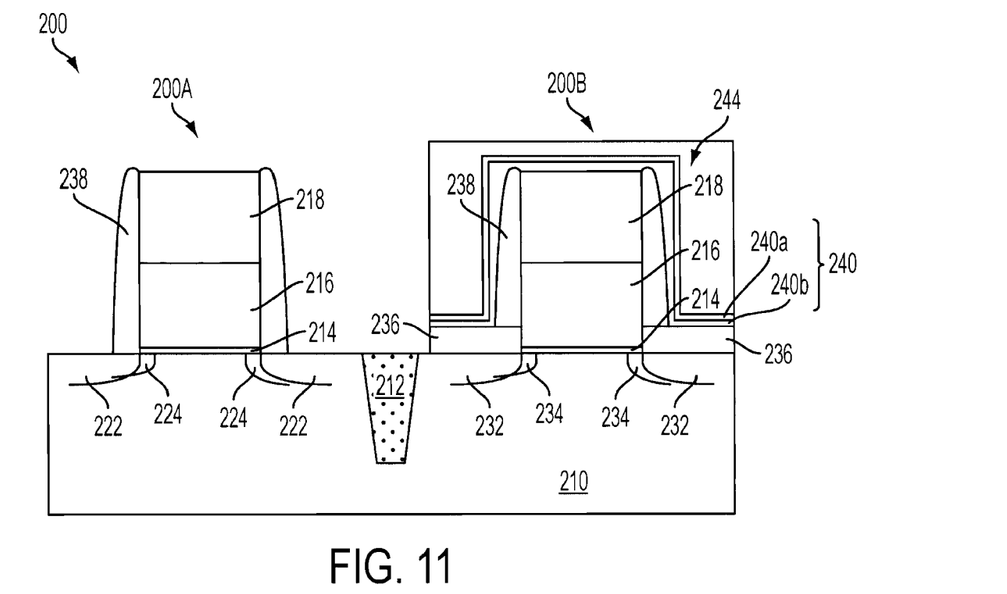

Referring to FIGS. 1 and 11-13, the method 100 proceeds to step 116 in which source/drain engineering is performed to configure the source/drain regions of the PMOS device region 200A. In FIG. 11, a protector 244 is provided on a portion of the protective layer 240 over the NMOS device 200B. In the depicted embodiment, the protector 244 is formed to protect a portion of the protective layer 240 over the NMOS device 200B during a later etching process for removing another portion of the protective layer 240 over the PMOS device 200A. The protector 244 may be formed by providing a layer (not shown), e.g., photo-resist layer or hard mask layer, on the substrate 210, the PMOS device 200A, and the NMOS device 200B, and then providing a patterning process to remove a portion of the layer over the PMOS device region 200A but leave the protector 244 over the NMOS device region 200B. An etching process is then provided to remove a portion of the top protective layer 240a and the bottom protective layer 240b not covered by the protector 244 and expose the surface of the substrate 210 around the PMOS device 200A. The etching process, for example, may include a first etching step and a second etching step for removing the portion of the top protective layer 240a and the portion of the bottom protective layer 240b by using the chemicals as mentioned above. Portions of the substrate 210 are exposed at either side of the gate structure of the PMOS device 200A after the etching process.

Figure 12:
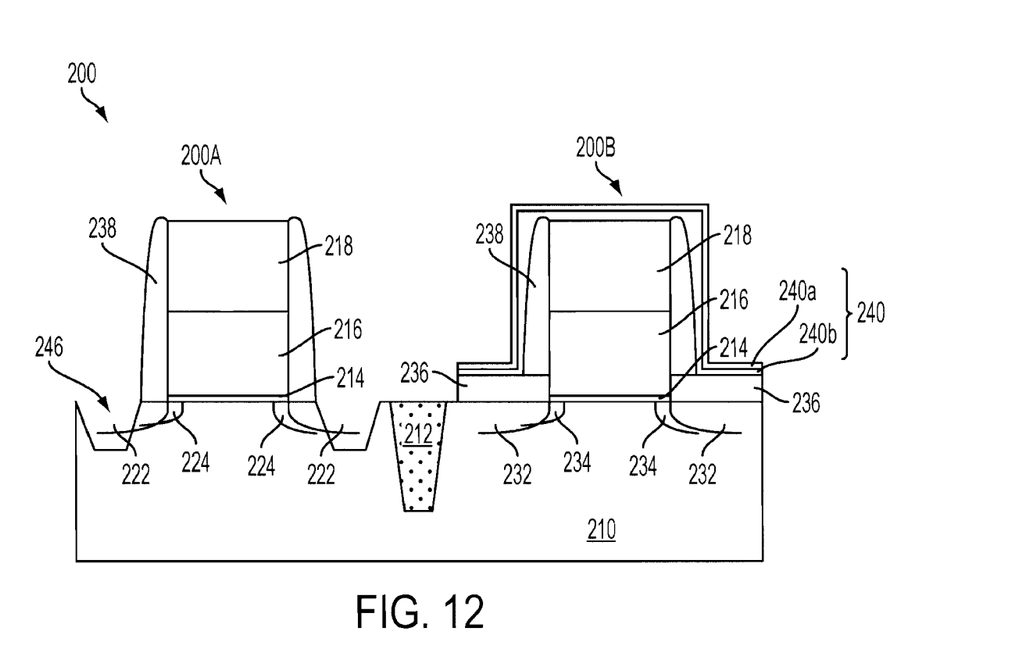

Referring to FIG. 12, the exposed portions of the substrate 210, particularly in the source and drain regions of the PMOS device 200A, are then removed by an etching process to form recesses 246 in the substrate 210. In some embodiments, the etching process includes a dry etching process, wet etching process, or combination thereof. In the depicted embodiment, the etching process utilizes a combination of dry and wet etching processes. The dry etching process, for example, includes etching gas of $NF_3$, $Cl_2$, $SF_6$, He, Ar, $CF_4$, or combinations thereof. The wet etching solution may include $NH_4OH$, HF (hydrofluoric acid), TMAH (tetramethylammonium hydroxide), other suitable wet etching solutions, or combinations thereof. After the etching process, a pre-cleaning process may be performed to clean the recesses 246 with a hydrofluoric acid (HF) solution or other suitable solution. The protector 244 is then removed by, for example, a dry and/or a wet stripping process.

Figure 13:
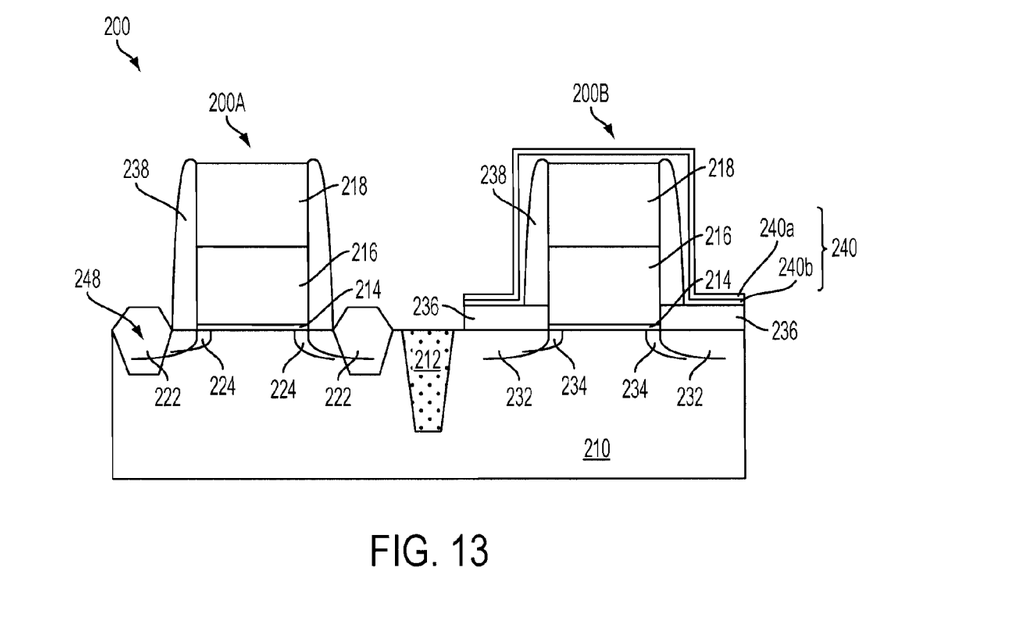

Referring to FIG. 13, a semiconductor material is formed in the recesses 246 to form source and drain features (strained structures) 248 of the PMOS device 200A. The source and drain features 248 may alternatively be referred to as raised source and drain regions. In the depicted embodiment, an epi process is provided to form the semiconductor material in the recesses 246. In some embodiments, the source and drain features 248 are formed from a material different from the substrate 210. Accordingly, the channel region of the PMOS device 200A is strained or stressed to enable carrier mobility of the device and enhance device performance. In the depicted embodiment, silicon germanium (SiGe) is formed by an epi process in the recesses 246 of the substrate 210 to form SiGe source and drain features 248 in a crystalline state on the silicon substrate 210. The SiGe source and drain features 248 may alternatively be referred to as raised source and drain regions. The source and drain features 248 associated with the gate structure of the PMOS device 200A may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 248 may further be exposed to annealing processes, such as a rapid thermal annealing process.

Figure 14:
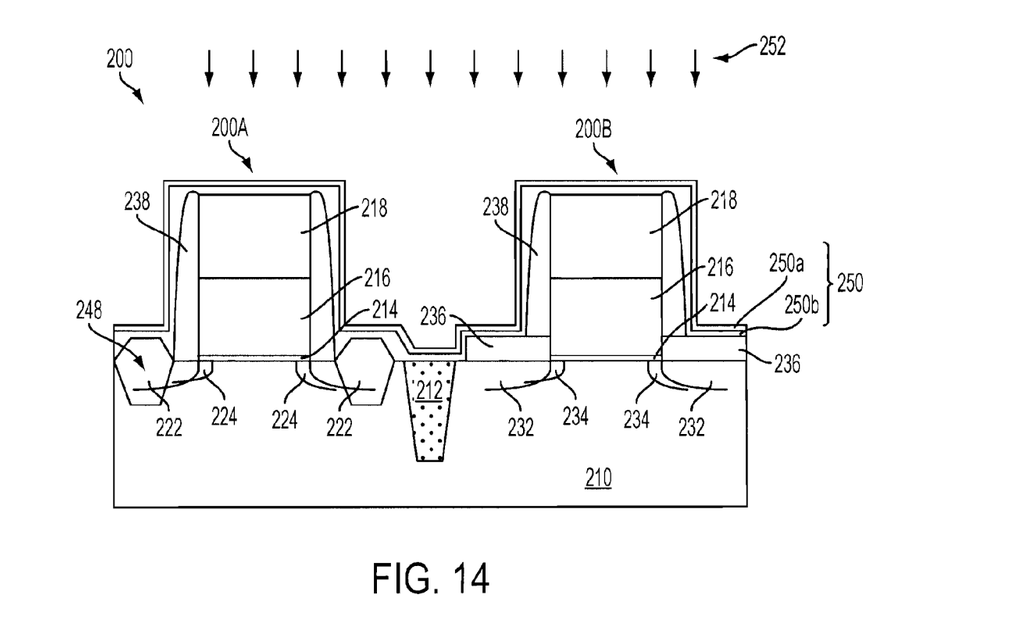

Referring to FIG. 14, the portion of the protective layer 240 over the gate structure of the NMOS device 200B is removed. In some embodiments, the portions of the top/bottom protective layers 240a/240b may be continuously removed by using the chemicals as mentioned above. Then, a protective layer 250 is formed over the substrate 210, the gate structures of the PMOS device 200A and the NMOS 200B. In some embodiments, the protective layer 250 comprises a top protective layer 250a and a bottom protective layer 250b.

The top protective layer 250a may function as a protector to decrease an amount of an epi, polycrystalline, or amorphous film formed thereon during a subsequent epi growth process. In some embodiments, the top protective layer 250a is a nitrogen-rich layer. In one embodiment, the top protective layer 250a is a nitrogen-containing and silicon-containing layer with an observed atomic ratio of Nitrogen to Silicon being greater than one. In another embodiment, the top protective layer 250a is a nitrogen-rich nitride layer ($Si_xN_y$) with an observed atomic ratio of Nitrogen to Silicon being greater than one (y/x>1), e.g., $Si_3N_4$. In other embodiment, the top protective layer 250a is a nitrogen-containing, silicon-containing, and oxygen-containing layer ($Si_xN_yO_z$) with an observed atomic ratio of Nitrogen to Silicon being greater than one (y/x>1). As mentioned above, the nitrogen-rich nitride layer has limited silicon dandling bonds on the surface and, therefore, less epi, polycrystalline, or amorphous film is formed thereon during the subsequent epi growth process. Hence, a high formation selectivity of epi film between a pre-determined region over the substrate 210 and the top protective layer 250a is achieved, wherein the pre-determined region is designed for forming the epi film and the top protective layer 250a is not suitable for the formation of the epi, polycrystalline, or amorphous film thereon. In the depicted embodiment, the top protective layer 250a has a thickness ranging between about 50 Angstroms and about 500 Angstroms. In some embodiments, the top protective layer 250a is formed using chemicals including $Si_2Cl_6$ and $NH_3$. In another embodiment, the top protective layer 250a is formed using chemicals including $Si_2Cl_6$ with a flow rate ranging from about 10 sccm to about 100 sccm and $NH_3$ with a flow rate ranging from about 1000 sccm to about 5000 sccm. In other embodiment, the top protective layer 250a is formed using chemicals of $Si_2Cl_6$ with a flow rate ranging from about 10 sccm to about 100 sccm and $NH_3$ with a flow rate ranging from about 2000 sccm to about 5000 sccm. In some embodiments, the top protective layer 250a is formed with a deposition pressure ranging between about 10 militorr and about 100 militorr, a deposition temperature ranging between about 400° C. and about 600° C., and a process time ranging between about 1 min and about 60 min, by LPCVD, PECVD, or ALD.

The bottom protective layer 250b may function as a buffer layer to provide an etching selectivity between the top protective layer 250a and the hard mask 218. In some embodiments, the bottom protective layer 250b includes a material different from the top protective layer 250a or the hard mask 218. The bottom protective layer 250b, for example, is oxide and/or oxynitride, formed by LPCVD, PECVD or ALD. The bottom protective layer 250b has a thickness ranging between about 10 Angstroms and about 100 Angstroms.

Still referring to FIG. 14, a treatment 252 is provided to the top protective layer 250a. In one embodiment, the treatment 252 may introduce additional species and react with the surface of the top protective layer 250a to further reduce the numbers of silicon dangling bonds by an energy source. The energy source of the treatment 252 may employ a thermal process, plasma process, or other suitable processes including ion implantation process, e-beam, ultraviolet (UV), or combinations thereof. In one embodiment, the treatment 252 is performed in an oxygen-containing ambient. In another embodiment, the treatment 252 is performed using oxygen gas, ozone gas, $N_2O$ gas, $NO_2$ gas, or combinations thereof. In other embodiments, the treatment 252 consists of about 1 ppm to about 1000 ppm $O_2$. In some embodiments, the treatment 252 is performed at a temperature ranging between about 500° C. and about 1100° C.

Figure 15:
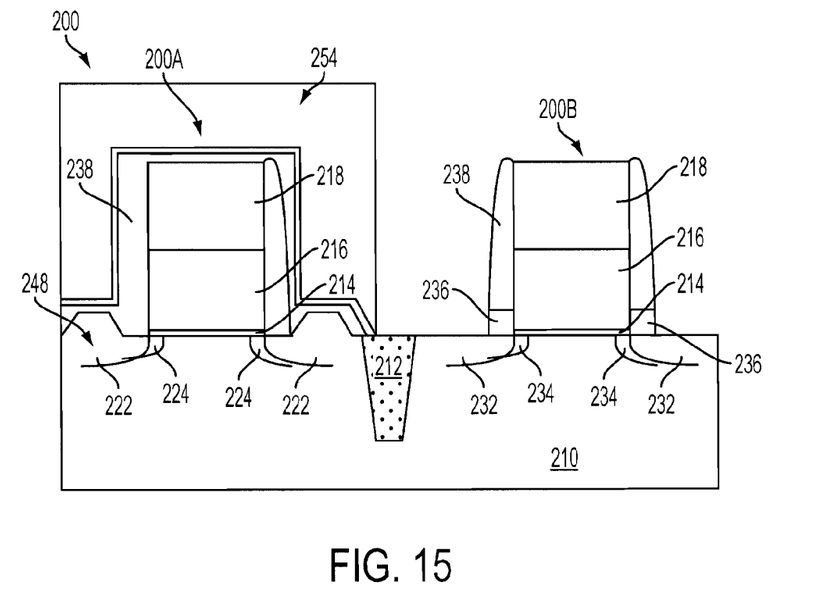
Figure 16:
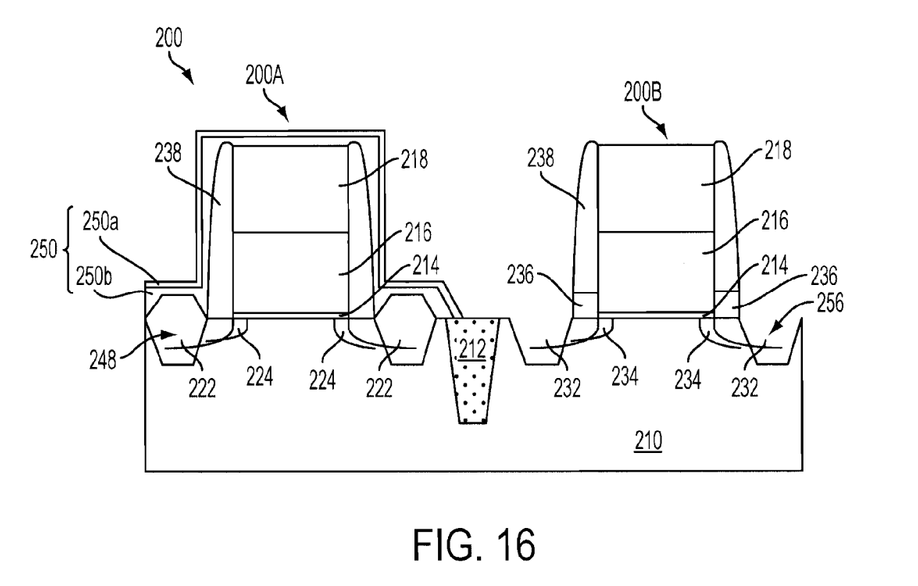
Figure 17:
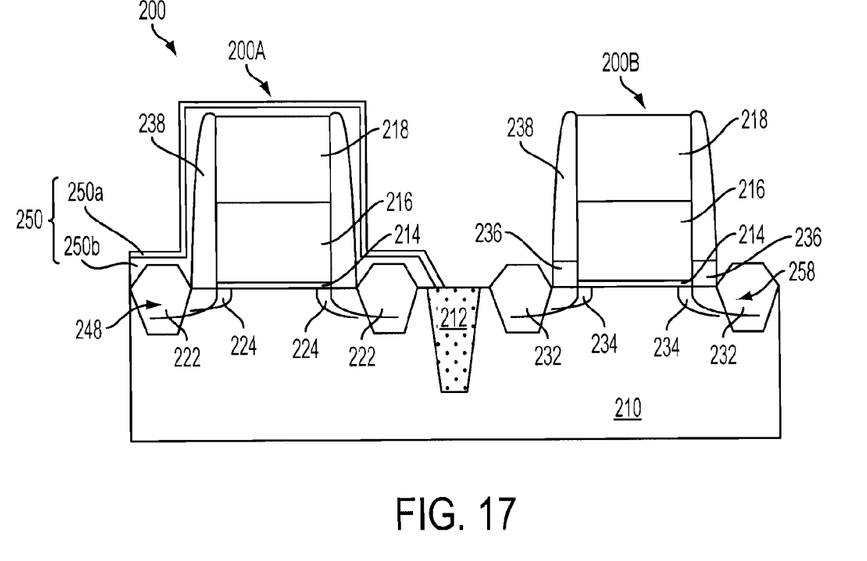

Referring to FIGS. 15-17, source/drain engineering is performed to configure the source/drain regions of the NMOS device 200B. In FIG. 15, a protector 254 is provided on a portion of the protective layer 250 over the PMOS device 200A. In the depicted embodiment, the protector 254 is formed to protect the protective layer 250 over the PMOS device 200A during a later etching process for removing another portion of the protective layer 250 over the NMOS device 200B. The protector 254 may be formed by providing a layer (not shown), e.g., photo-resist layer or hard mask layer, on the substrate 210, the PMOS device 200A, and the NMOS device 200B, and then providing a patterning process to remove a portion of the layer over the NMOS device region 200B but leave the protector 254 over the PMOS device 200A. An etching process is then provided to remove a portion of the top protective layer 250a, the bottom protective layer 250b, and the features 236 not covered by the protector 254 and expose the surface of the substrate 210 around the NMOS device 200B. The etching process, for example, may include a first etching step and a second etching step for removing the portion of the top protective layer 250a and the portion of the bottom protective layer 250b by using the chemicals as mentioned above. Portions of the substrate 210 are exposed at either side of the gate structure of the NMOS device 200B after the etching process.

Referring to FIG. 16, the exposed portions of the substrate 210, particularly in the source and drain regions of the NMOS device 200B, are then removed by an etching process to form recesses 256 in the substrate 210. In some embodiments, the etching process includes a dry etching process, wet etching process, or combination thereof. In the depicted embodiment, the etching process utilizes a combination of dry and wet etching processes. The dry etching process, for example, includes etching gas of $NF_3$, $Cl_2$, $SF_6$, He, Ar, $CF_4$, or combinations thereof. The wet etching solution may include $NH_4OH$, HF (hydrofluoric acid), TMAH (tetramethylammonium hydroxide), other suitable wet etching solutions, or combinations thereof. After the etching process, a pre-cleaning process may be performed to clean the recesses 256 with a hydrofluoric acid (HF) solution or other suitable solution. The protector 254 is then removed by, for example, a dry and/or a wet stripping process.

Referring to FIG. 17, a semiconductor material is formed in the recesses 256 to form source and drain features (strained structures) 258 of the NMOS device 200B. In the depicted embodiment, the source and drain features 258 include epitaxially grown silicon (epi Si). The epi Si source and drain features 258 associated with the gate structure of the NMOS device 200B may be in-situ doped or undoped during the epi process. For example, the epi Si source and drain features 258 may be doped with phosphorous to form Si:P source and drain features or doped with carbon to form Si:C source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 258 may alternatively be referred to as raised source and drain regions. The source and drain features 258 may further be exposed to annealing processes, such as a rapid thermal annealing process.

Figure 18:
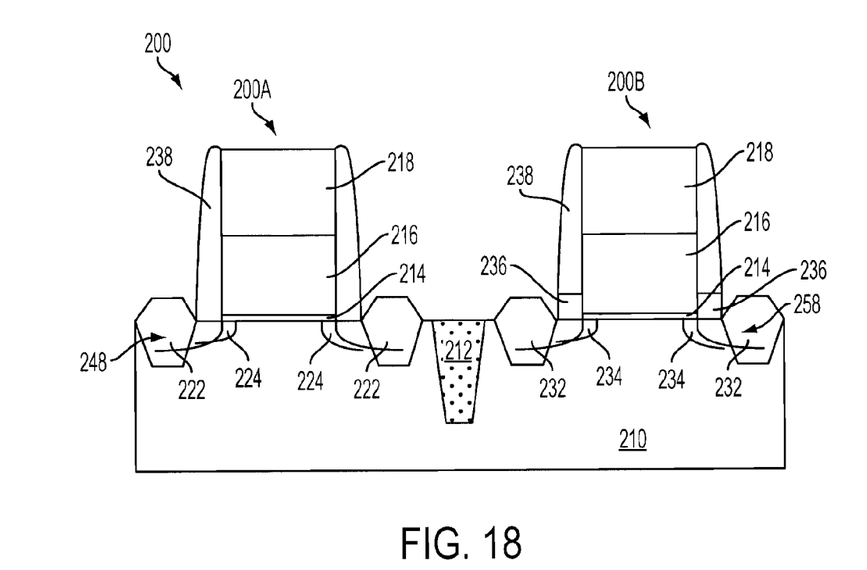

Referring to FIG. 18, the portion of the protective layer 250 over the gate structure of the PMOS device 200A is removed. In some embodiments, the portions of the top/bottom protective layers 250a/250b may be completely removed by using the chemicals as mentioned above.

Subsequent processing may implement a gate replacement process. For example, metal gates may replace the gate electrode 216 (i.e., polysilicon gate layer) of the gate structures of the PMOS/NMOS devices 200A, 200B. A first metal gate having a first work function may be formed in the gate structure of the NMOS devices 200B and a second gate structure having a second work function may be formed in the gate structure of the PMOS devices 200A. The metal gates may comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
providing a substrate having a first region and a second region;
forming a first gate structure over the first region and a second gate structure over the second region;
forming a nitrogen-rich protective layer over the first and the second gate structures;
removing a portion of the nitrogen-rich protective layer over the second gate structure;
after removing the portion of the nitrogen-rich protective layer, forming features at upper sides of the second gate structure by an epitaxial (epi) growth process;
forming sidewall spacers on the first and second gate structures;
forming a second protective layer over the first and second gate structures with the sidewall spacers;
removing a portion of the second protective layer over the first gate structure;
forming a second feature adjacent to an edge of the first gate structure by an epi growth process; and
removing a remaining portion of the second protective layer after forming the second feature.

2. The method of claim 1, wherein the feature is at least one of Si, SiGe, Si:P, or Si:C.

3. The method of claim 1, wherein the nitrogen-rich protective layer is composed of a nitrogen-rich silicon nitride film or silicon oxynitride.

4. The method of claim 1, wherein the nitrogen-rich protective layer is formed using $Si_2Cl_6$ with a flow rate ranging from about 10 sccm to about 100 sccm and $NH_3$ with a flow rate ranging from about 1000 sccm to about 5000 sccm.

5. The method of claim 1, further comprising:
providing a treatment to the nitrogen-rich protective layer in an oxygen-containing ambient.

6. The method of claim 5, wherein the treatment consists of about 1 ppm to about 1000 ppm $O_2$.

7. The method of claim 5, wherein the treatment is performed by using at least one of oxygen gas, ozone gas, $N_2O$ gas, $NO_2$ gas, or combinations thereof.

8. The method of claim 5, wherein the treatment is a thermal anneal process with a temperature ranging between about 500° C. and about 1000° C.

9. The method of claim 1, further comprising:
forming a buffer layer under the nitrogen-rich protective layer.

10. The method of claim 9, wherein the buffer layer is at least one of silicon oxide or oxynitride.

11. The method of claim 1, wherein forming the second feature comprises:
forming a recess in the substrate; and
forming the second feature in the recess.

12. The method of claim 1, further including, prior to forming the feature at either side of the second gate structure, removing a portion of the nitrogen-rich protective layer over the second gate structure.

13. A method for manufacturing a CMOS device, the method comprising:
forming a semiconductor substrate;
forming a first gate structure and a second gate structure over the semiconductor substrate;
performing a first implantation process with a first dopant in the semiconductor substrate, thereby forming first lightly doped source and drain (LDD) regions adjacent to the first gate structure and being interposed by the first gate structure;

performing a second implantation process with a second dopant in the semiconductor substrate, the second dopant being an opposite type to the first dopant, thereby forming second lightly doped source and drain (LDD) regions adjacent to the second gate structure and being interposed by the second gate structure;

forming spacers for the first and the second gate structures;

forming a first nitrogen-rich protective layer over the first gate structure;

removing portions of the semiconductor substrate at either side of the second gate structure, thereby forming first recesses in the semiconductor substrate that defines first source and drain regions in the semiconductor substrate; and epitaxially (epi) growing a first semiconductor material to fill the first recesses, thereby forming first source and drain features;

after epi growing the first semiconductor material, forming a second nitrogen-rich protection layer over the second gate structure;

removing portions of the semiconductor substrate adjacent either side of the first gate structure, thereby forming second recesses in the semiconductor substrate that defines second source and drain regions in the semiconductor substrate; and epi growing a second semiconductor material to fill the second recesses, thereby forming second source and drain features.

14. The method of claim 13, wherein the nitrogen-rich protective layer is composed of a nitrogen-rich silicon nitride film.

15. The method of claim 13, wherein the nitrogen-rich protective layer is SixNy or SixNyOz, with y/x>1.

16. The method of claim 13, wherein the nitrogen-rich protective layer is Si3N4.

17. The method of claim 13, wherein the nitrogen-rich protective layer is formed using $Si_2Cl_6$ with a flow rate ranging from about 10 sccm to about 100 sccm and $NH_3$ with a flow rate ranging from about 1000 sccm to about 5000 sccm.

18. The method of claim 13, further comprising:
providing a treatment to the nitrogen-rich protective layer in an oxygen-containing ambient.

19. The method of claim 13, further comprising:
forming an oxide buffer layer under the nitrogen-rich protective layer.

20. A method for manufacturing a IC device, the method comprising:
providing a semiconductor substrate having a first region and a second region;

forming a first and a second gate structures over the semiconductor substrate in the first and second regions, respectively;

forming first and second lightly doped source and drain (LDD) regions in the first and second regions, respectively;

forming raised features on the semiconductor substrate in the second region at either side of the second gate structure;

forming spacers on sidewalls of the first and second gate structures and over at least a portion of the raised features;

forming a first buffer layer over the first and the second gate structures;

forming a first nitrogen-rich silicon nitride layer over the first buffer layer;

performing a first treatment to the first nitrogen-rich silicon nitride layer;

removing a portion of the treated first nitrogen-rich silicon nitride layer and the underlying first buffer layer to expose the first gate structure;

forming first recesses in the semiconductor substrate at either side of the first gate structure;

epitaxially (epi) growing a first semiconductor material to fill the first recesses;

forming a second buffer layer over the first and the second gate structures;

forming a second nitrogen-rich silicon nitride layer over the second buffer layer;

performing a second treatment to the second nitrogen-rich silicon nitride layer;

removing a portion of the treated second nitrogen-rich silicon nitride layer and the underlying second buffer layer to expose the second gate structure;

forming second recesses in the semiconductor substrate adjacent either side of the second gate structure, wherein the second recesses define source and drain regions in the semiconductor substrate; and epitaxially (epi) growing a second semiconductor material to fill the second recesses.

* * * * *